US010103735B1

(12) United States Patent
Herr

(10) Patent No.: US 10,103,735 B1
(45) Date of Patent: Oct. 16, 2018

(54) TWO-INPUT TWO-OUTPUT SUPERCONDUCTING GATE

(71) Applicant: Quentin P. Herr, Ellicott City, MD (US)

(72) Inventor: Quentin P. Herr, Ellicott City, MD (US)

(73) Assignee: NORTHROP GRUMMAN SYSTEMS CORPORATION, Falls Church, VA (US)

(*) Notice: Subject to any disclaimer, the term of this patent is extended or adjusted under 35 U.S.C. 154(b) by 0 days.

(21) Appl. No.: 15/684,613

(22) Filed: Aug. 23, 2017

(51) Int. Cl.
*H03K 19/195* (2006.01)
*H03K 17/92* (2006.01)

(52) U.S. Cl.
CPC ........... *H03K 19/195* (2013.01); *H03K 17/92* (2013.01)

(58) Field of Classification Search
CPC .............................. H03K 19/195; H03K 17/92
USPC .............................................................. 326/6
See application file for complete search history.

(56) References Cited

U.S. PATENT DOCUMENTS 7,724,020 B2   5/2010  Herr
2017/0104491 A1*  4/2017  Shauck ................ H03K 19/195

OTHER PUBLICATIONS

Herr, et al.: "Ultra-Low-Power Superconductor Logic"; Journal of Applied Physics, 109.10 (2011): 103903.

* cited by examiner

*Primary Examiner* — Don Le
(74) *Attorney, Agent, or Firm* — Tarolli, Sundheim, Covell & Tummino LLP

(57) ABSTRACT

One example includes a superconducting gate system. The system includes a first input that is configured to provide a first input pulse and a second input that is configured to provide a second input pulse. The system also includes a gate configured to provide a first output pulse at a first output corresponding to a first logic function with respect to the first and second input pulses and based on a positive bias inductor and a first Josephson junction that are each coupled to the first output. The gate is also configured to provide a second output pulse at a second output corresponding to a second logic function with respect to the first and second input pulses and based on a negative bias inductor and a second Josephson junction that are each coupled to the second output.

23 Claims, 2 Drawing Sheets

US 10,103,735 B1

TWO-INPUT TWO-OUTPUT SUPERCONDUCTING GATE

TECHNICAL FIELD

This disclosure relates generally to quantum and classical circuit systems, and specifically to a two-input two-output superconducting gate.

BACKGROUND

In the field of digital logic, extensive use is made of well known and highly developed CMOS (complimentary metal-oxide semiconductor) technology. As CMOS has begun to approach maturity as a technology, there is an interest in alternatives that may lead to higher performance in terms of speed, power dissipation computational density, interconnect bandwidth, and the like. An alternative to CMOS technology comprises superconductor based single flux quantum circuitry, utilizing superconducting Josephson junctions, with typical signal power of around 4 nW (nanowatts), at a typical data rate of 20 Gb/s (gigabytes/second), or greater, and operating temperatures of around 4° Kelvin.

SUMMARY

One example includes a superconducting gate system. The system includes a first input that is configured to provide a first input pulse and a second input that is configured to provide a second input pulse. The system also includes a gate configured to provide a first output pulse at a first output corresponding to a first logic function with respect to the first and second input pulses and based on a positive bias inductor and a first Josephson junction that are each coupled to the first output. The gate is also configured to provide a second output pulse at a second output corresponding to a second logic function with respect to the first and second input pulses and based on a negative bias inductor and a second Josephson junction that are each coupled to the second output.

Another example includes a superconducting gate system. The system includes a first input that is configured to provide a first input pulse and a second input that is configured to provide a second input pulse. The system also includes a gate configured to provide a first output pulse at a first output corresponding to a logic-OR function with respect to the first and second input pulses and based on a first Josephson junction that is coupled to the first output and a secondary winding of a transformer that interconnects the first output and a low-voltage rail. The transformer further comprises a primary winding through which a flux bias current is applied to add a bias to the first Josephson junction. The gate is also configured to provide a second output pulse at a second output corresponding to a logic-AND function with respect to the first and second input pulses and based on a second Josephson junction that is coupled to the second output and a negative bias inductor interconnecting the second output and a low-voltage rail that is configured to decrease a bias associated with the second Josephson junction.

Another example includes a superconducting gate system. The system includes a first input that is configured to provide a first input pulse and a second input that is configured to provide a second input pulse. The system also includes a gate. The gate includes a first Josephson junction and a positive bias inductor coupled to a first output, a first storage inductor interconnecting the first input and the first output and being configured to provide a first persistent current in response to the first input pulse, and a second storage inductor interconnecting the second input and the first output and being configured to provide a second persistent current in response to the second input pulse. The first Josephson junction is configured to trigger in response to the positive bias inductor and a combination of the first and second persistent currents. The gate also includes a second Josephson junction and a negative bias inductor coupled to a second output, a third storage inductor interconnecting the first input and the second output and being configured to provide a third persistent current in response to the first input pulse, and a fourth storage inductor interconnecting the second input and the second output and being configured to provide a fourth persistent current in response to the second input pulse. The second Josephson junction is configured to trigger in response to the negative bias inductor and a combination of the third and fourth persistent currents.

DETAILED DESCRIPTION

This disclosure relates generally to quantum and classical circuit systems, and specifically to a two-input two-output superconducting gate. The superconducting gate can correspond to a gate that is configured to provide two logic functions, such as two different logic functions, in response to a pair of inputs. As an example, the two logic functions can correspond to a logic-AND operation and a logic-OR operation on the respective pair of inputs. As an example, the inputs can each be provided via a Josephson transmission line (JTL), such as in a Reciprocal Quantum Logic (RQL) superconducting circuit. As a result, the pair of input signals can be provided as RQL pulses that include both a positive pulse (e.g., fluxon) and a negative pulse (e.g., anti-fluxon). Therefore, the superconducting gate can provide an indication of the presence of at least one input pulse with respect to the pair of inputs at a logic-OR output and/or the presence of both input pulses with respect to the pair of inputs at a logic-AND output.

As an example, the superconducting gate can include a positive bias inductor that is coupled to a first output and a negative bias inductor that is coupled to the second output. For example, the positive bias inductor can correspond to a secondary winding of a transformer that provides a bias flux current, such that the positive bias inductor adds a bias to a first Josephson junction coupled to the first output. Therefore, the first Josephson junction can be configured to trigger in response to at least one of the input pulses provided on the respective pair of inputs to provide an output pulse that is indicative of a logic-OR output. As another example, the negative bias inductor can correspond to an inductor that interconnects the second output and a low-voltage rail (e.g., ground), such that the negative bias inductor subtracts a bias from a second Josephson junction coupled to the second output. Therefore, the second Josephson junction can be configured to trigger in response to both of the input pulses provided on the respective pair of inputs to provide an output pulse that is indicative of a logic-AND output.

Figure 1:
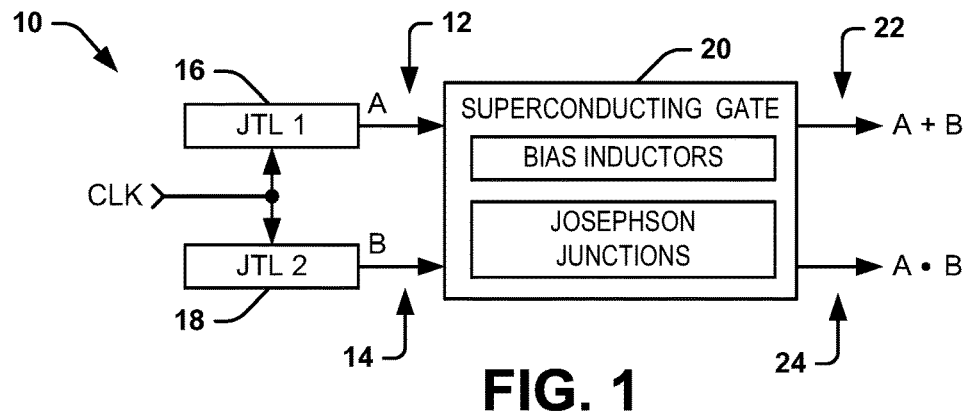
FIG. 1 illustrates an example of a superconducting gate system.

FIG. 1 illustrates an example of a superconducting gate system 10. The superconducting gate system 10 can be provided in a classical and/or superconducting circuit to provide concurrent logic functions of a pair of inputs. In the example of FIG. 1, a first input pulse "A" is provided at a first input 12 and a second input pulse "B" is provided at a second input 14. In the example of FIG. 1, the input pulses A and B are provided via a first Josephson transmission line (JTL) 16 and a second JTL 18, that are each operated based on a clock signal CLK. As an example, the clock signal CLK can correspond to a Reciprocal Quantum Logic (RQL) clock signal to provide the input pulses A and B as RQL pulse signals. Therefore, each of the input pulses A and B can include a positive pulse (e.g., fluxon) that is followed by a negative pulse (e.g., anti-fluxon).

The superconducting gate system 10 includes a superconducting gate 20 that is configured to provide a first logic function at a first output 22 and a second logic function at a second output 24 with respect to the input pulses A and B. In the example of FIG. 1, the first logic function is demonstrated as a logic-OR function, demonstrated as "A+B", and the second logic function is demonstrated as a logic-AND function, demonstrated as "A•B". As an example, the superconducting gate 20 can be configured to convert the input pulses A and B to persistent currents, as described in greater detail herein, such that the input pulses A and B need not be provided substantially concurrently (e.g., they do not have to be coincident with each other, but can occur within same clock cycle) for the superconducting gate 20 to provide the respective first and second logic functions.

In the example of FIG. 1, the superconducting gate 20 includes Josephson junctions 26 and bias inductors 28. As an example, the Josephson junctions 26 can include a first Josephson junction that is coupled to the first output 22 and a second Josephson junction that is coupled to the second output 24. The bias inductors 28 can include a positive bias inductor that is coupled to the first output 22 and a negative bias inductor that is coupled to the second output 24. For example, the positive bias inductor can correspond to a secondary winding of a transformer that provides a bias flux current, such that the positive bias inductor adds a bias to the first Josephson junction. Thus, the first Josephson junction can be configured to trigger in response to the presence of at least one of the input pulses A and B, and thus can provide an output pulse corresponding to a logic-OR operation with respect to the first and second input pulses A and B based on the positive bias inductor. The negative bias inductor can correspond to an inductor that interconnects the second output 24 and a low-voltage rail (e.g., ground), such that the negative bias inductor subtracts a bias from the second Josephson junction. Therefore, the second Josephson junction can be configured to trigger in response to both of the input pulses A and B, and thus can provide an output pulse corresponding to a logic-AND operation with respect to the first and second input pulses A and B based on the negative bias inductor. As described in greater detail herein, by implementing the positive bias inductor and the negative bias inductor, the superconducting gate system 10 can operate with improved parametric operating margins relative to typical superconducting gate systems, and can implement a reduced mutual inductive cross-coupling of associated storage inductors to provide for a more physically compact design.

Figure 2:
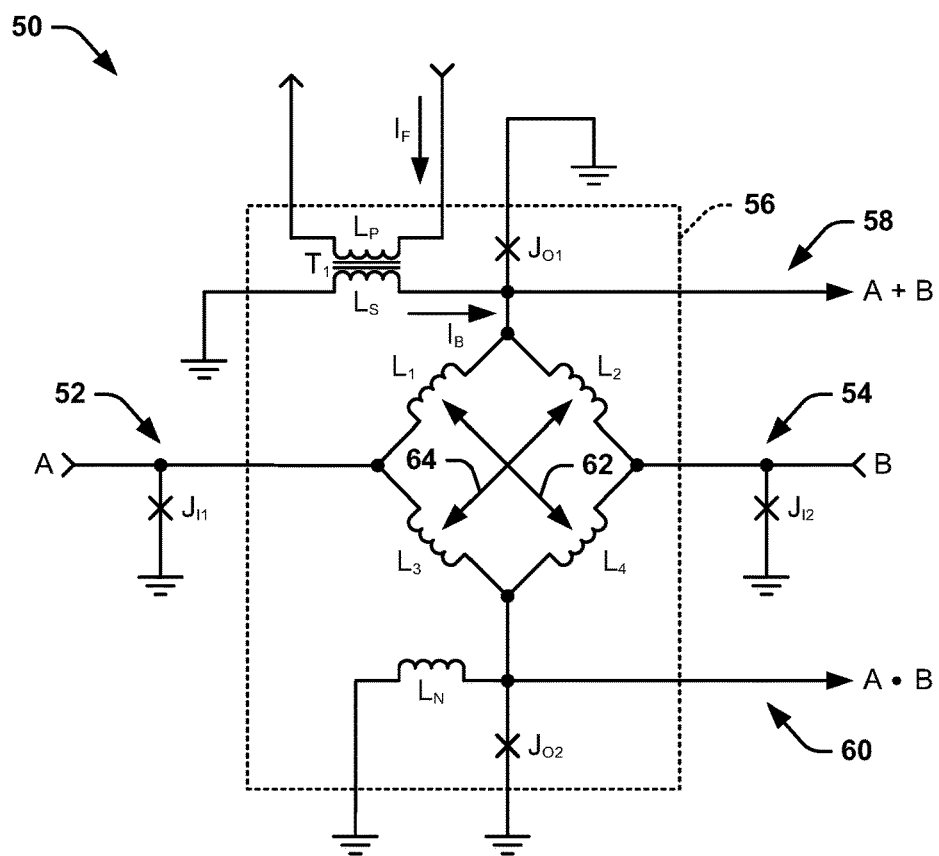
FIG. 2 illustrates an example of a superconducting gate circuit.

FIG. 2 illustrates an example of a superconducting gate circuit 50. The superconducting gate circuit 50 can correspond to the superconducting gate system 10 in the example of FIG. 1. Therefore, reference is to be made to the example of FIG. 1 in the following description of the example of FIG. 2.

The superconducting gate circuit 50 includes a first input 52 and a second input 54. The first input 52 includes a first input Josephson junction $J_{I1}$ and the second input 54 includes a second Josephson junction $J_{I2}$. As an example, the first and second Josephson junctions $J_{I1}$ and $J_{I2}$ can each be associated with respective JTLs (e.g., the JTLs 16 and 18, respectively, in the example of FIG. 1) that are configured to provide the first input pulse A and the second input pulse B, respectively, in response to triggering (e.g., based on propagation of the input pulses A and B as single flux quantum (SFQ) pulses). As an example, the input pulses A and B can be provided as RQL pulse signals that include a positive pulse (e.g., fluxon) that is followed by a negative pulse (e.g., anti-fluxon).

The superconducting gate circuit 50 includes a superconducting gate 56 that is configured to provide a first logic function at a first output 58 based on a first Josephson junction $J_{O1}$ and a second logic function at a second output 60 based on a second Josephson junction $J_{O2}$, each with respect to the input pulses A and B. In the example of FIG. 2, the first logic function is demonstrated as a logic-OR function, demonstrated as an output pulse "A+B", and the second logic function is demonstrated as a logic-AND function, demonstrated as an output pulse "A•B". As demonstrated in greater detail herein, each of the first and second Josephson junctions $J_{O1}$ and $J_{O2}$ can be configured to trigger based on a majority-three presence of persistent input currents. In the example of FIG. 2, the first Josephson junction $J_{O1}$ can be configured to trigger in response to at least one of the input pulses A and B to provide the output pulse A+B on the first output 58 that corresponds to the logic-OR function. Similarly, the second Josephson junction $J_{O2}$ can be configured to trigger in response to both of the input pulses A and B to provide the output pulse A•B on the second output 60 that corresponds to the logic-AND function.

The superconducting gate 56 includes a first storage inductor $L_1$ interconnecting the first input 52 and the first output 58, a second storage inductor $L_2$ interconnecting the second input 54 and the first output 58, a third storage inductor $L_3$ interconnecting the first input 52 and the second output 60, and a fourth storage inductor $L_4$ interconnecting the second input 54 and the second output 60. The first and third storage inductors $L_1$ and $L_3$ are each configured to provide a respective persistent current in response to the first input pulse A, and the second and fourth storage inductors $L_2$ and $L_4$ are each configured provide a respective persistent current in response to the second input pulse B. Because the superconducting gate circuit 50 is configured as a superconducting circuit, the persistent currents that are generated in the storage inductors $L_1$, $L_2$, $L_3$, and/or $L_4$ are persistent, such that the persistent currents will remain until the respective Josephson junctions $J_{O1}$ and/or $J_{O2}$ are triggered, as described in greater detail. Therefore, the input pulses A and B are not necessarily required to be concurrent with each other, but can occur within same clock cycle to be provided as a valid input to provide the respective output pulses A•B and A+B.

In the example of FIG. 2, the first and fourth storage inductors $L_1$ and $L_4$ are demonstrated as having a mutual inductive cross-coupling, demonstrated at 62, and the second and third storage inductors are demonstrated as having a mutual inductive cross-coupling, demonstrated at 64. As an example, the mutual inductive cross-coupling of the first and fourth storage inductors $L_1$ and $L_4$ can be approximately equal to the mutual inductive cross-coupling of the second and third storage inductors $L_2$ and $L_3$, and can be have a small mutual inductive cross-coupling value, such as k<approximately 0.5 (e.g., k approximately equal to 0.2). Based on the mutual inductive cross-coupling of the respective pairs of the first and fourth storage inductors $L_1$ and $L_4$ and the second and third storage inductors $L_2$ and $L_3$, the output pulses A•B and A+B generated via the first and second Josephson junctions $J_{O1}$ and $J_{O2}$ are substantially prevented from propagating back to the inputs 52 and 54 via the respective storage inductors $L_1$, $L_2$, $L_3$, and/or $L_4$. However, because the mutual inductive cross-coupling of the respective pairs of the first and fourth storage inductors $L_1$ and $L_4$ and the second and third storage inductors $L_2$ and $L_3$ can be very small, the size of the storage inductors $L_1$, $L_2$, $L_3$, and $L_4$ can be substantially reduced relative to other circuits that implement such mutual inductive cross-coupling. As a result, the superconducting gate circuit 50 can be fabricated in a substantially more compact manner than typical circuits that implement mutual inductive cross-coupling of opposing inductors.

In addition, the superconducting gate 56 includes a transformer $T_1$ that is formed by a primary winding $L_P$ and a secondary winding $L_S$. The primary winding $L_P$ is configured to conduct a bias flux current $I_F$ that is induced in the secondary winding $L_S$ as a bias current $I_B$. Therefore, the secondary winding $L_S$ of the transformer $T_1$ is configured as a positive bias inductor interconnecting the first output 56 and the low-voltage rail (e.g., ground), such that the bias current $I_B$ increases a bias with respect to the first Josephson junction $J_{O1}$. The positive bias inductor effect of the secondary winding $L_S$ of the transformer $T_1$ therefore operates as a persistent current with respect to the majority-three input arrangement of the first Josephson junction $J_{O1}$. As a result, the first Josephson junction $J_{O1}$ can be configured to trigger in response to a single persistent current provided via either the first storage inductor $L_1$ or the second storage inductor $L_2$ in addition to the bias current $I_B$ to provide the majority-three input to the first Josephson junction $J_{O1}$. Therefore, the first Josephson junction $J_{O1}$ is configured to trigger in response to at least one of the persistent currents provided from the first storage inductor $L_1$ and the second storage inductor $L_2$ that are generated in response to the first input pulse A or the second input pulse B, respectively, in addition to the persistent current of the bias current $I_B$, to provide the output pulse A+B corresponding to the logic-OR function.

Additionally, the superconducting gate 56 includes a negative bias inductor $L_N$ interconnecting the second output 58 and the low-voltage rail (e.g., ground). The negative bias inductor $L_N$ is configured to increase a load on the second Josephson junction $J_{O2}$, such that the negative bias inductor $L_N$ decreases a bias (e.g., provides a negative bias) with respect to the second Josephson junction $J_{O2}$. The negative bias inductor effect of the negative bias inductor $L_N$ therefore operates as zero-amplitude persistent current with respect to the majority-three input arrangement of the second Josephson junction $J_{O2}$. As a result, the second Josephson junction $J_{O2}$ can be configured to trigger in response to two persistent currents provided via the third storage inductor $L_3$ and the fourth storage inductor $L_4$ to provide the majority-three input to the second Josephson junction $J_{O2}$ based on the decrease of the bias of the second Josephson junction $J_{O2}$ resulting from the negative bias inductor $L_N$. Therefore, the second Josephson junction $J_{O2}$ is configured to trigger in response to both of the persistent currents provided from the third storage inductor $L_3$ and the fourth storage inductor $L_4$ that are generated in response to the first input pulse A and the second input pulse B, respectively, to provide the output pulse A•B corresponding to the logic-AND function.

As described previously, the superconducting gate circuit 50 can be implemented in an RQL circuit, such that the input pulses A and B can correspond to RQL pulses provided from respective JTLs that propagate the input pulses A and B based on an RQL clock. Thus, the negative pulses from the input pulses A and B can be provided to the superconducting gate 56 to reset the superconducting gate 56 after the output pulse(s) A•B and/or A+B are provided. For example, in response to triggering based on a fluxon associated with the RQL input pulses A and B, the first and/or second input Josephson junctions $J_{I1}$ and/or $J_{I2}$ can switch from a zero superconducting phase to a $2\pi$ superconducting phase to provide the respective persistent currents. Similarly, in response to triggering based on the persistent current(s), the first and/or second Josephson junctions $J_{O1}$ and/or $J_{O2}$ can switch from a zero superconducting phase to a $2\pi$ superconducting phase to provide the respective output pulse(s) A•B and/or A+B. The triggering of the first Josephson junction $J_{O1}$ can thus eliminate a respective one of the persistent currents associated with the first and/or second storage inductors $L_1$ and $L_2$, and the triggering of the second Josephson junction $J_{O2}$ can thus eliminate a respective one of the persistent currents associated with the third and/or fourth storage inductors $L_3$ and $L_4$.

Subsequently, the first and/or second input Josephson junctions $J_{I1}$ and/or $J_{I2}$ can "untrigger", and thus switch from the $2\pi$ superconducting phase to the zero superconducting phase in response to a subsequent negative fluxon associated with the RQL input pulses A and B. In response to the untriggering of the first input Josephson junction $J_{I1}$, the first and third storage inductors $L_1$ and $L_3$ can conduct a negative persistent current that flows toward the first input Josephson junction $J_{I1}$. Similarly, in response to the untriggering of the second input Josephson junction $J_{I2}$, the second and fourth storage inductors $L_2$ and $L_4$ can conduct a negative persistent current that flows toward the second input Josephson junction $J_{I2}$. The negative persistent current associated with the first and second storage inductors $L_1$ and $L_2$ can thus untrigger the first Josephson junction $J_{O1}$, and thus switches the superconducting phase of the first Josephson junction $J_{O1}$ from $2\pi$ to zero, which in turn eliminates the respective negative persistent currents in the first and second storage inductors $L_1$ and $L_2$. Similarly, the negative persistent current associated with the third and fourth storage inductors $L_3$ and $L_4$ can thus untrigger the second Josephson junction $J_{O2}$, and thus switches the superconducting phase of the second Josephson junction $J_{O2}$ from $2\pi$ to zero, which in turn eliminates the respective negative persistent currents in the third and fourth storage inductors $L_3$ and $L_4$. Accordingly, the negative fluxon of the RQL input pulses A and B return the superconducting gate 56 back to a neutral state, and thus able to receive subsequent RQL input pulses A and B to provide the respective logic functions at the outputs 58 and 60.

Figure 3:
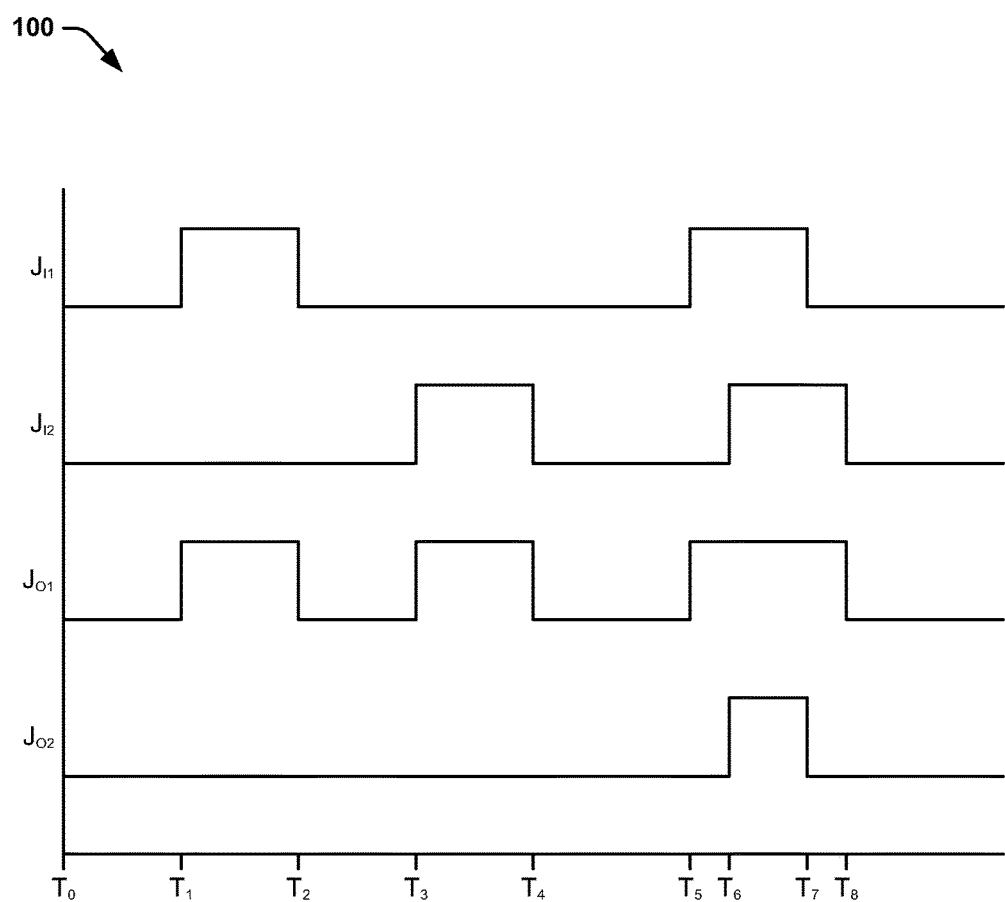
FIG. 3 illustrates an example of a timing diagram.

FIG. 3 illustrates an example of a timing diagram 100. The timing diagram 100 can be associated with operation of the superconducting gate system 10 in the example of FIG. 1 or the superconducting gate circuit 50 in the example of FIG. 2. Therefore, reference is to be made to the example of FIGS. 1 and 2 in the following description of the example of FIG. 3.

The timing diagram 100 demonstrates a superconducting phase of the first input Josephson junction $J_{I1}$, demonstrated as "$J_{I1}$" in the example of FIG. 3, and a superconducting phase of the second input Josephson junction $J_{I2}$, demonstrated as "$J_{I2}$" in the example of FIG. 3. Additionally, the timing diagram 100 demonstrates a superconducting phase of the first Josephson junction $J_{O1}$, demonstrated as "$J_{O1}$" in the example of FIG. 3, and a superconducting phase of the second Josephson junction $J_{O2}$, demonstrated as "$J_{O2}$" in the example of FIG. 3. The superconducting phases of the respective Josephson junctions $J_{I1}$, $J_{I2}$, $J_{O1}$, and $J_{O2}$ can switch between a zero superconducting phase, analogous to a logic-low state, and a $2\pi$ superconducting phase, analogous to a logic-high state. Therefore, the superconducting phases demonstrated in the timing diagram 100 can correspond to the presence of the input pulses A and B, as provided by the superconducting phases of the respective input Josephson junctions $J_{I1}$ and $J_{I2}$, and to the output pulses A•B and A+B, as provided by the superconducting phases of the respective input Josephson junctions $J_{I1}$ and $J_{I2}$.

At a time $T_0$, the superconducting phases of the Josephson junctions $J_{I1}$, $J_{I2}$, $J_{O1}$, and $J_{O2}$ is demonstrated as a zero superconducting phase, and the superconducting gate circuit 50 is in a steady state awaiting input. At a time $T_1$, the input pulse A is provided to trigger the first input Josephson junction $J_{I1}$, such that the first input Josephson junction $J_{I1}$ switches from zero superconducting phase to $2\pi$ superconducting phase. In response, a persistent current is provided through the first storage inductor $L_1$ and the third storage inductor $L_3$. The persistent current through the first storage inductor $L_1$ combines with the current $I_B$ provided from the secondary winding $L_S$ of the transformer $T_1$ to provide a majority of the majority-three input arrangement of the first Josephson junction $J_{O1}$, which thus exceeds a critical threshold sufficient to trigger the first Josephson junction $J_{O1}$. As a result, at approximately the time $T_1$, the first Josephson junction $J_{O1}$ triggers to switch from zero superconducting phase to $2\pi$ superconducting phase, and thus provides the output pulse A+B. Accordingly, the output pulse A+B is provided to indicate the logic-OR operation in response to receiving one of the input pulses A and B.

In addition, while the persistent current is being provided through the third storage inductor $L_3$, at the time $T_1$, the second Josephson junction $J_{O2}$ is not triggered, and thus does not switch from the zero superconducting phase to $2\pi$ superconducting phase. As described previously, the loading of the negative bias inductor $L_N$ on the second Josephson junction is such that the persistent current through the third storage inductor $L_3$ is insufficient to exceed the critical threshold of the second Josephson junction $J_{O2}$ based on the lack of majority of the majority-three input arrangement of the second Josephson junction $J_{O2}$. Therefore, the second Josephson junction $J_{O2}$ does not trigger at the time $T_1$. Accordingly, the output pulse A•B is not provided to indicate the logic-AND operation in response to receiving one of the input pulses A and B.

At a time $T_2$, the input pulse A is no longer provided, and thus the first input Josephson junction $J_{I1}$ switches from $2\pi$ superconducting phase to zero superconducting phase. For example, the input pulse A can be an RQL pulse, such that a complementary anti-fluxon is provided at the time $T_2$ to untrigger the first input Josephson junction $J_{I1}$. In response, the first Josephson junction $J_{O1}$ can likewise untrigger, as described previously, to switch from $2\pi$ superconducting phase to zero superconducting phase, and thus maintaining the logic-OR operation in response to neither of the pair of inputs being provided in a manner similar to classical digital computing.

At a time $T_3$, the input pulse B is provided to trigger the second input Josephson junction $J_{I2}$, such that the second input Josephson junction $J_{I2}$ switches from zero superconducting phase to $2\pi$ superconducting phase. In response, a persistent current is provided through the second storage inductor $L_2$ and the fourth storage inductor $L_4$. The persistent current through the second storage inductor $L_2$ combines with the current $I_B$ provided from the secondary winding $L_S$ of the transformer $T_1$, which thus exceeds a critical threshold sufficient to trigger the first Josephson junction $J_{O1}$ to provide a majority of the majority-three input arrangement of the first Josephson junction $J_{O1}$. As a result, at approximately the time $T_3$, the first Josephson junction $J_{O1}$ triggers to switch from zero superconducting phase to $2\pi$ superconducting phase, and thus provides the output pulse A+B. Accordingly, the output pulse A+B is provided to indicate the logic-OR operation in response to receiving one of the input pulses A and B.

In addition, while the persistent current is being provided through the fourth storage inductor $L_4$, at the time $T_3$, the second Josephson junction $J_{O2}$ is not triggered, and thus does not switch from the zero superconducting phase to $2\pi$ superconducting phase. As described previously, the loading of the negative bias inductor $L_N$ on the second Josephson junction is such that the persistent current through the fourth storage inductor $L_4$ is insufficient to exceed the critical threshold of the second Josephson junction $J_{O2}$ based on the lack of majority of the majority-three input arrangement of the second Josephson junction $J_{O2}$. Therefore, the second Josephson junction $J_{O2}$ does not trigger at the time $T_3$. Accordingly, the output pulse A•B is not provided to indicate the logic-AND operation in response to receiving one of the input pulses A and B.

At a time $T_4$, the input pulse B is no longer provided, and thus the second input Josephson junction $J_{I2}$ switches from $2\pi$ superconducting phase to zero superconducting phase. For example, the input pulse B can be an RQL pulse, such that a complementary anti-fluxon is provided at the time $T_4$ to untrigger the second input Josephson junction $J_{I2}$. In response, the second Josephson junction $J_{O2}$ can likewise untrigger, as described previously, to switch from $2\pi$ superconducting phase to zero superconducting phase, and thus maintaining the logic-OR operation in response to neither of the pair of inputs being provided in a manner similar to classical digital computing.

At a time $T_5$, the input pulse A is provided to trigger the first input Josephson junction $J_{I1}$, such that the first input Josephson junction $J_{I1}$ switches from zero superconducting phase to $2\pi$ superconducting phase. In response, a persistent current is provided through the first storage inductor $L_1$ and the third storage inductor $L_3$, such that the first Josephson junction $J_{O1}$ is triggered, similar to as described previously at the time $T_1$. Therefore, the output pulse A+B is provided at the time $T_5$ to indicate the logic-OR operation in response to receiving one of the input pulses A and B. At a time $T_6$, the input pulse B is provided to trigger the second input Josephson junction $J_{I2}$, such that the second input Josephson junction $J_{I2}$ switches from zero superconducting phase to $2\pi$ superconducting phase. In response, a persistent current is provided through the second storage inductor $L_2$ and the fourth storage inductor $L_4$, such that the second Josephson junction $J_{O2}$ is triggered, similar to as described previously at the time $T_3$.

In addition, at the time $T_6$, the second Josephson junction $J_{O2}$ switches from the zero superconducting phase to $2\pi$ superconducting phase. As described previously, the loading of the negative bias inductor $L_N$ on the second Josephson junction is such that the bias of the second Josephson junction $J_{O2}$ is decreased. However, in response to the combined persistent currents through both the third storage inductor $L_3$ and the fourth storage inductor $L_4$, a majority of the majority-three input arrangement of the second Josephson junction $J_{O2}$ is provided, such that the critical threshold of the second Josephson junction $J_{O2}$ is exceeded to trigger the second Josephson junction $J_{O2}$. Therefore, the second Josephson junction $J_{O2}$ triggers at the time $T_6$. Accordingly, the output pulse A•B is provided at the time $T_6$ to indicate the logic-AND operation in response to receiving both of the input pulses A and B. In addition, the triggering of the second Josephson junction $J_{O2}$ provides a negative persistent current (e.g., from ground) to flow through the negative bias inductor $L_N$.

At a time $T_7$, the input pulse A is no longer provided, and thus the first input Josephson junction $J_{I1}$ switches from $2\pi$ superconducting phase to zero superconducting phase. In response, the second Josephson junction $J_{O2}$ can likewise untrigger to switch from $2\pi$ superconducting phase to zero superconducting phase. As an example, because of the negative persistent current that flows through the negative bias inductor $L_N$, only a single anti-fluxon can be provided on either of the A or B inputs to untrigger the second Josephson junction $J_{O2}$. Thus, the switching of the second Josephson junction $J_{O2}$ from $2\pi$ superconducting phase to zero superconducting phase is demonstrated in the example of FIG. 3 as the logic-AND operation in response to only one of the pair of inputs being provided after the time $T_7$. At a time $T_8$, the input pulse B is no longer provided, and thus the second input Josephson junction $J_{I2}$ switches from $2\pi$ superconducting phase to zero superconducting phase. In response, the first Josephson junction $J_{O1}$ can likewise untrigger, as described previously, to switch from $2\pi$ superconducting phase to zero superconducting phase, and thus maintaining the logic-OR operation in response to neither of the pair of inputs being provided. Accordingly, the superconducting gate circuit 50 operates in a manner substantially similar to classical digital computing based on the superconducting phases of the respective Josephson junctions $J_{I1}$, $J_{I2}$, $J_{O1}$, and $J_{O2}$.

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims. Additionally, where the disclosure or claims recite "a," "an," "a first," or "another" element, or the equivalent thereof, it should be interpreted to include one or more than one such element, neither requiring nor excluding two or more such elements. As used herein, the term "includes" means includes but not limited to, and the term "including" means including but not limited to. The term "based on" means based at least in part on.

What is claimed is:

1. A superconducting gate system comprising:
    a first input that is configured to provide a first input pulse;
    a second input that is configured to provide a second input pulse; and
    a gate configured to provide a first output pulse at a first output corresponding to a first logic function with respect to the first and second input pulses and based on a positive bias inductor and a first Josephson junction that are each coupled to the first output, and to provide a second output pulse at a second output corresponding to a second logic function with respect to the first and second input pulses and based on a negative bias inductor and a second Josephson junction that are each coupled to the second output.

2. The system of claim 1, wherein the first logic function is a logic-OR function and the second logic function is a logic-AND function.

3. The system of claim 1, wherein the positive bias inductor is a secondary winding of a transformer that interconnects the first output and a low-voltage rail, wherein the transformer further comprises a primary winding through which a flux bias current is applied to add a bias to the first Josephson junction, wherein the negative bias inductor interconnects the second output and a low-voltage rail and is configured to decrease a bias associated with the second Josephson junction.

4. The system of claim 3, wherein the first Josephson junction is triggered in response to at least one of the first input pulse and the second input pulse to provide the first output pulse, such that the first logic function is a logic-OR function associated with the first and second input pulses, and wherein the second Josephson junction is triggered in response to both of the first input pulse and the second input pulse to provide the second output pulse, such that the second logic function is a logic-AND function associated with the first and second input pulses.

5. The system of claim 1, wherein the first input is configured as a first Josephson transmission line (JTL) configured to provide the first input pulse, and wherein the second input is configured as a second JTL configured to provide the second input pulse.

6. The system of claim 5, wherein the first JTL is configured to provide the first input pulse as a first Reciprocal Quantum Logic (RQL) input pulse via an RQL clock signal, and wherein the second JTL is configured to provide the second input pulse as a second RQL input pulse via the RQL clock signal.

7. The system of claim 6, wherein each of the first and second RQL input pulses comprises a positive pulse followed by a negative pulse, such that the positive pulse of at least one of the first and second RQL input pulses triggers the first Josephson junction, and the negative pulse of at least one of the first and second RQL input pulses resets the first Josephson junction, and such that the positive pulse of both the first and second RQL input pulses triggers the second Josephson junction, and the negative pulse of at least one of the first and second RQL input pulses resets the second Josephson junction.

8. The system of claim 1, wherein the gate comprises:
    a first storage inductor interconnecting the first input and the first output and being configured to provide a first persistent current in response to the first input pulse;
    a second storage inductor interconnecting the second input and the first output and being configured to provide a second persistent current in response to the second input pulse;
    a third storage inductor interconnecting the first input and the second output being configured to provide a third persistent current in response to the first input pulse; and
    a fourth storage inductor interconnecting the second input and the second output and being configured to provide a fourth persistent current in response to the second input pulse.

9. The system of claim 8, wherein each of the first Josephson junction and the second Josephson junction comprise a triggering threshold that is greater than an amplitude of any one of the first, second, third, and fourth persistent currents.

10. The system of claim 8, wherein the first storage inductor and the fourth storage inductor are mutually inductively cross-coupled, and wherein the second storage inductor and the third storage inductor are mutually inductively cross-coupled, wherein each of the mutual inductive cross-couplings of the first and fourth storage inductors and the second and third storage inductors, respectively has a mutual coupling factor k of less than 0.5.

11. The system of claim 1, wherein the negative bias inductor is a separate circuit element from the positive bias inductor, and wherein the negative bias inductor is configured to provide a zero-amplitude persistent negative current to the second Josephson junction.

12. A superconducting gate system comprising:
a first input that is configured to provide a first input pulse;
a second input that is configured to provide a second input pulse; and
a gate configured to provide a first output pulse at a first output corresponding to a logic-OR function with respect to the first and second input pulses and based on a first Josephson junction that is coupled to the first output and a secondary winding of a transformer that interconnects the first output and a low-voltage rail, wherein the transformer further comprises a primary winding through which a flux bias current is applied to add a bias to the first Josephson junction, and to provide a second output pulse at a second output corresponding to a logic-AND function with respect to the first and second input pulses and based on a second Josephson junction that is coupled to the second output and a negative bias inductor interconnecting the second output and a low-voltage rail that is configured to decrease a bias associated with the second Josephson junction.

13. The system of claim 12, wherein the first input is configured as a first Josephson transmission line (JTL) configured to provide the first input pulse, and wherein the second input is configured as a second JTL configured to provide the second input pulse.

14. The system of claim 13, wherein the first JTL is configured to provide the first input pulse as a first Reciprocal Quantum Logic (RQL) input pulse via an RQL clock signal, and wherein the second JTL is configured to provide the second input pulse as a second RQL input pulse via the RQL clock signal.

15. The system of claim 14, wherein each of the first and second RQL input pulses comprises a positive pulse followed by a negative pulse, such that the positive pulse of at least one of the first and second RQL input pulses triggers the first Josephson junction, and the negative pulse of at least one of the first and second RQL input pulses resets the first Josephson junction, and such that the positive pulse of both the first and second RQL input pulses triggers the second Josephson junction, and the negative pulse of at least one of the first and second RQL input pulses resets the second Josephson junction.

16. The system of claim 12, wherein the gate comprises:
a first storage inductor interconnecting the first input and the first output and being configured to provide a first persistent current in response to the first input pulse;
a second storage inductor interconnecting the second input and the first output and being configured to provide a second persistent current in response to the second input pulse;
a third storage inductor interconnecting the first input and the second output being configured to provide a third persistent current in response to the first input pulse; and
a fourth storage inductor interconnecting the second input and the second output and being configured to provide a fourth persistent current in response to the second input pulse.

17. The system of claim 16, wherein the first storage inductor and the fourth storage inductor are mutually inductively cross-coupled, and wherein the second storage inductor and the third storage inductor are mutually inductively cross-coupled, wherein each of the mutual inductive cross-couplings of the first and fourth storage inductors and the second and third storage inductors, respectively has a mutual coupling factor k of less than 0.5.

18. The system of claim 12, wherein the negative bias inductor is a separate circuit element from the primary winding, and wherein the negative bias inductor is configured to provide a zero-amplitude persistent negative current to the second Josephson junction.

19. A superconducting gate system comprising:
a first input that is configured to provide a first input pulse;
a second input that is configured to provide a second input pulse; and
a gate comprising:
a first Josephson junction and a positive bias inductor coupled to a first output;
a first storage inductor interconnecting the first input and the first output and being configured to provide a first persistent current in response to the first input pulse;
a second storage inductor interconnecting the second input and the first output and being configured to provide a second persistent current in response to the second input pulse, wherein the first Josephson junction is configured to trigger in response to the positive bias inductor and a combination of the first and second persistent currents;
a second Josephson junction and a negative bias inductor coupled to a second output;
a third storage inductor interconnecting the first input and the second output and being configured to provide a third persistent current in response to the first input pulse;
a fourth storage inductor interconnecting the second input and the second output and being configured to provide a fourth persistent current in response to the second input pulse, wherein the second Josephson junction is configured to trigger in response to the negative bias inductor and a combination of the third and fourth persistent currents.

20. The system of claim 19, wherein the positive bias inductor is a secondary winding of a transformer that interconnects the first output and a low-voltage rail, wherein the transformer further comprises a primary winding through which a flux bias current is applied to add a bias to the first Josephson junction to trigger the first Josephson junction in response to at least one of the first and second persistent currents, wherein the negative bias inductor interconnects the second output and a low-voltage rail and is configured to decrease a bias associated with the second Josephson junction to trigger the second Josephson junction in response to both of the third and fourth persistent currents.

21. The system of claim 19, wherein the first input is configured as a first Josephson transmission line (JTL) configured to provide the first input pulse as a first Reciprocal Quantum Logic (RQL) input pulse via an RQL clock signal, and wherein the second input is configured as a second JTL configured to provide the second input pulse as a second RQL input pulse via the RQL clock signal.

22. The system of claim 19, wherein the first storage inductor and the fourth storage inductor are mutually inductively cross-coupled, and wherein the second storage inductor and the third storage inductor are mutually inductively cross-coupled, wherein each of the mutual inductive cross-couplings of the first and fourth storage inductors and the second and third storage inductors, respectively has a mutual coupling factor k of less than 0.5.

23. The system of claim 19, wherein the negative bias inductor is a separate circuit element from the positive bias inductor, and wherein the negative bias inductor is configured to provide a zero-amplitude persistent negative current to the second Josephson junction.

\* \* \* \* \*